US012247852B2

(12) United States Patent
Kanda et al.

(10) Patent No.: US 12,247,852 B2
(45) Date of Patent: Mar. 11, 2025

(54) MAGNETIC SENSOR

(71) Applicant: Panasonic Intellectual Property Management Co., Ltd., Osaka (JP)

(72) Inventors: Kazuhiro Kanda, Fukui (JP); Masahiko Ohbayashi, Osaka (JP); Yuki Ohyama, Fukui (JP); Hideyuki Tanigawa, Osaka (JP); Masataka Tagawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 97 days.

(21) Appl. No.: 18/252,150

(22) PCT Filed: Nov. 16, 2021

(86) PCT No.: PCT/JP2021/042083
§ 371 (c)(1),
(2) Date: May 8, 2023

(87) PCT Pub. No.: WO2022/107763
PCT Pub. Date: May 27, 2022

(65) Prior Publication Data
US 2024/0003711 A1    Jan. 4, 2024

Related U.S. Application Data

(60) Provisional application No. 63/117,154, filed on Nov. 23, 2020.

(30) Foreign Application Priority Data

Apr. 9, 2021  (JP) .................................. 2021-066711
Apr. 9, 2021  (JP) .................................. 2021-066712

(51) Int. Cl.
*G01D 5/16*    (2006.01)

(52) U.S. Cl.
CPC ....................................... *G01D 5/16* (2013.01)

(58) Field of Classification Search
CPC .......... G01B 7/00; H01L 29/82; H10N 50/00; H10N 50/10; G01R 33/02; G01R 33/0206;
(Continued)

(56) References Cited

U.S. PATENT DOCUMENTS 5,243,280 A *   9/1993   Kusumi ................. G01B 7/003
                                                  324/252
2003/0107373 A1*   6/2003   Van Zon ................ G01R 33/09
                                                  324/252
(Continued)

FOREIGN PATENT DOCUMENTS

CN       1584504 A       2/2005
JP    H01-227482 A       9/1989
(Continued)

OTHER PUBLICATIONS

International Search Report dated Jan. 11, 2022 issued in International Patent Application No. PCT/JP2021/042083, with English translation.
(Continued)

*Primary Examiner* — Huy Q Phan
*Assistant Examiner* — David B Frederiksen
(74) *Attorney, Agent, or Firm* — Rimon P.C.

(57) ABSTRACT

A magnetic sensor according to the present disclosure includes a plurality of magnetoresistance pattern portions that forms a bridge circuit. Each of the plurality of magnetoresistance pattern portions includes a first resistance portion and a second resistance portion that are connected together in series. In each of the plurality of magnetoresis-
(Continued)

tance pattern portions, the first resistance portion and the second resistance portion are spaced from each other in a first direction by a distance that is one half as long as a cycle of magnetization of a detection target. In each of the plurality of magnetoresistance pattern portions, the first resistance portion and the second resistance portion are symmetric to each other with respect to a line when viewed in plan in a third direction.

6 Claims, 5 Drawing Sheets

(58) Field of Classification Search
CPC .... G01R 33/09–098; G01D 5/12; G01D 5/14; G01D 5/16
See application file for complete search history.

(56) References Cited

U.S. PATENT DOCUMENTS

| | | | |
|---|---|---|---|
| 2004/0189295 | A1 | 9/2004 | Sato et al. |
| 2005/0270020 | A1 | 12/2005 | Peczalski et al. |
| 2007/0035293 | A1 | 2/2007 | Fukuoka et al. |
| 2013/0038421 | A1* | 2/2013 | Kawasaki ........... H01F 10/3272 338/32 R |
| 2014/0367813 | A1 | 12/2014 | Ryu et al. |
| 2018/0275217 | A1 | 9/2018 | Uchida et al. |
| 2019/0393173 | A1 | 12/2019 | Sunamoto et al. |

FOREIGN PATENT DOCUMENTS

| | | |
|---|---|---|
| JP | H03-029875 A | 2/1991 |
| JP | H05-075180 A | 3/1993 |
| JP | H06-104504 A | 4/1994 |
| JP | H07-077531 A | 3/1995 |
| JP | H07-226546 A | 8/1995 |
| JP | H08-068661 A | 3/1996 |
| JP | H09-260741 A | 10/1997 |
| JP | H11-148841 A | 6/1999 |
| JP | 2001-043981 A | 2/2001 |
| JP | 2001-141514 A | 5/2001 |
| JP | 2001-244521 A | 9/2001 |
| JP | 2005-227134 A | 8/2005 |
| JP | 2011-007569 A | 1/2011 |
| JP | 2011-146735 A | 7/2011 |
| JP | 2015-060954 A | 3/2015 |
| JP | 2016-211046 A | 12/2016 |
| JP | 2020-141091 A | 9/2020 |
| JP | 2020-178045 A | 10/2020 |
| JP | 2020-187064 A | 11/2020 |
| WO | 2018/150971 A1 | 8/2018 |
| WO | 2019/111547 A1 | 6/2019 |

OTHER PUBLICATIONS

International Search Report dated Feb. 1, 2022 issued in International Patent Application No. PCT/JP2021/042084, with English translation.
International Search Report dated Jan. 11, 2022 issued in International Patent Application No. PCT/JP2021/042085 with English translation.
International Search Report dated Jan. 18, 2022 issued in International Patent Application No. PCT/JP2021/042086, with English translation.
Notice of Allowance dated Oct. 30, 2024 issued in related U.S. Appl. No. 18/252,306.

* cited by examiner

MAGNETIC SENSOR

CROSS-REFERENCE OF RELATED APPLICATIONS

This application is the U.S. National Phase under 35 U.S.C. § 371 of International Patent Application No. PCT/JP2021/042083, filed on Nov. 16, 2021, which in turn claims the benefit of Japanese Patent Application No. 2021-066711, filed on Apr. 9, 2021, Japanese Patent Application No. 2021-066712, filed on Apr. 9, 2021, and U.S. Provisional Patent Application No. 63/117,154, filed on Nov. 23, 2020, the entire disclosures of which Applications are incorporated by reference herein.

TECHNICAL FIELD

The present disclosure generally relates to a magnetic sensor, and more particularly relates to a magnetic sensor including a plurality of magnetoresistance pattern portions.

BACKGROUND ART

Patent Literature 1 discloses a position detection device including a magnetic recording medium (detection target) on which magnetic information is recorded and a magnetic detection means (magnetic sensor) which moves relative to the magnetic recording medium to detect the magnetic information. The position detection device of Patent Literature 1 detects the position of the magnetic recording medium using a magnetoresistive element as the magnetic detection means.

Patent Literature 2 discloses a magnetic sensor including a flexible assembly in which a magnetic detection unit, a thin film conductor (wiring pattern portion), and electrode terminals (including power supply terminals and ground terminals) are formed on a flexible substrate. The magnetic detection unit includes four patterns (magnetoresistance pattern portions) which are arranged side by side in a moving direction (first direction) of a magnetic medium (detection target). Two patterns, which are located at both ends in the moving direction, out of the four patterns each include an extended portion, which is extended outside of the pattern in a direction (second direction) intersecting with the moving direction and which forms part of the thin film conductor.

CITATION LIST

Patent Literature

Patent Literature 1: JP H08-68661 A
Patent Literature 2: JP 2005-227134 A

SUMMARY OF INVENTION

In the known position detection device, the positioning accuracy of the magnetic recording medium may decline depending on the pattern shape of the magnetoresistive element.

It is therefore an object of the present disclosure to provide a magnetic sensor with the ability to reduce the chances of causing a decline in the positioning accuracy of the detection target.

A magnetic sensor according to an aspect of the present disclosure detects a position of a detection target based on a change in magnetic field strength to be caused by relative movement of the detection target in a first direction. The detection target is magnetized in the first direction in a predetermined cycle of magnetization. The magnetic sensor includes a plurality of magnetoresistance pattern portions that form a bridge circuit. The plurality of magnetoresistance pattern portions are arranged side by side in the first direction. Each of the plurality of magnetoresistance pattern portions includes a first resistance portion and a second resistance portion that are connected together in series. Each of the first resistance portion and the second resistance portion is formed in a second direction perpendicular to the first direction. In each of the plurality of magnetoresistance pattern portions, the first resistance portion and the second resistance portion are spaced from each other in the first direction by a distance that is one half as long as the cycle of magnetization. In each of the plurality of magnetoresistance pattern portions, the first resistance portion and the second resistance portion are symmetric to each other with respect to a line when viewed in plan in a third direction perpendicular to both the first direction and the second direction.

DESCRIPTION OF EMBODIMENTS

A magnetic sensor 1 according to an embodiment will be described with reference to FIGS. 1-5. FIGS. 1-3 and 5 to be referred to in the following description of embodiments and their variations are all schematic representations. Thus, the ratio of the dimensions (including thicknesses) of respective constituent elements illustrated on the drawings does not always reflect their actual dimensional ratio.

Embodiment (1) Overview

First, an overview of a magnetic sensor 1 according to an embodiment will be described with reference to FIGS. 1-3.

The magnetic sensor 1 detects the position of a detection target 2 using magnetism. The magnetic sensor 1 may be used as, for example, a position sensor such as a linear encoder or a rotary encoder. More specifically, the magnetic sensor 1 may be used as, for example, a position sensor (encoder) for detecting, for example, the position of a camera lens driven by a motor (such as a linear motor or a rotary motor). Alternatively, the magnetic sensor 1 may also be used as, for example, a position sensor for detecting the position of a brake pedal, a brake lever, or a gear shift of an automobile. However, these are only exemplary uses of the magnetic sensor 1 and should not be construed as limiting. As used herein, the "position" to be detected by the magnetic sensor 1 is a concept encompassing both the coordinates of the detection target 2 and the rotational angle defined by the detection target 2 around a rotational axis (virtual axis)

passing through the detection target 2 (i.e., the orientation of the detection target 2). That is to say, the magnetic sensor 1 detects at least one of the coordinates of the detection target 2 or the rotational angle defined by the detection target 2.

In the following description, an embodiment in which the magnetic sensor 1 is used as a linear encoder will be described as an example. The linear encoder may be an increment type or an absolute type, whichever is appropriate. In this embodiment, the magnetic sensor 1 detects the coordinates of the detection target 2.

Figure 5:
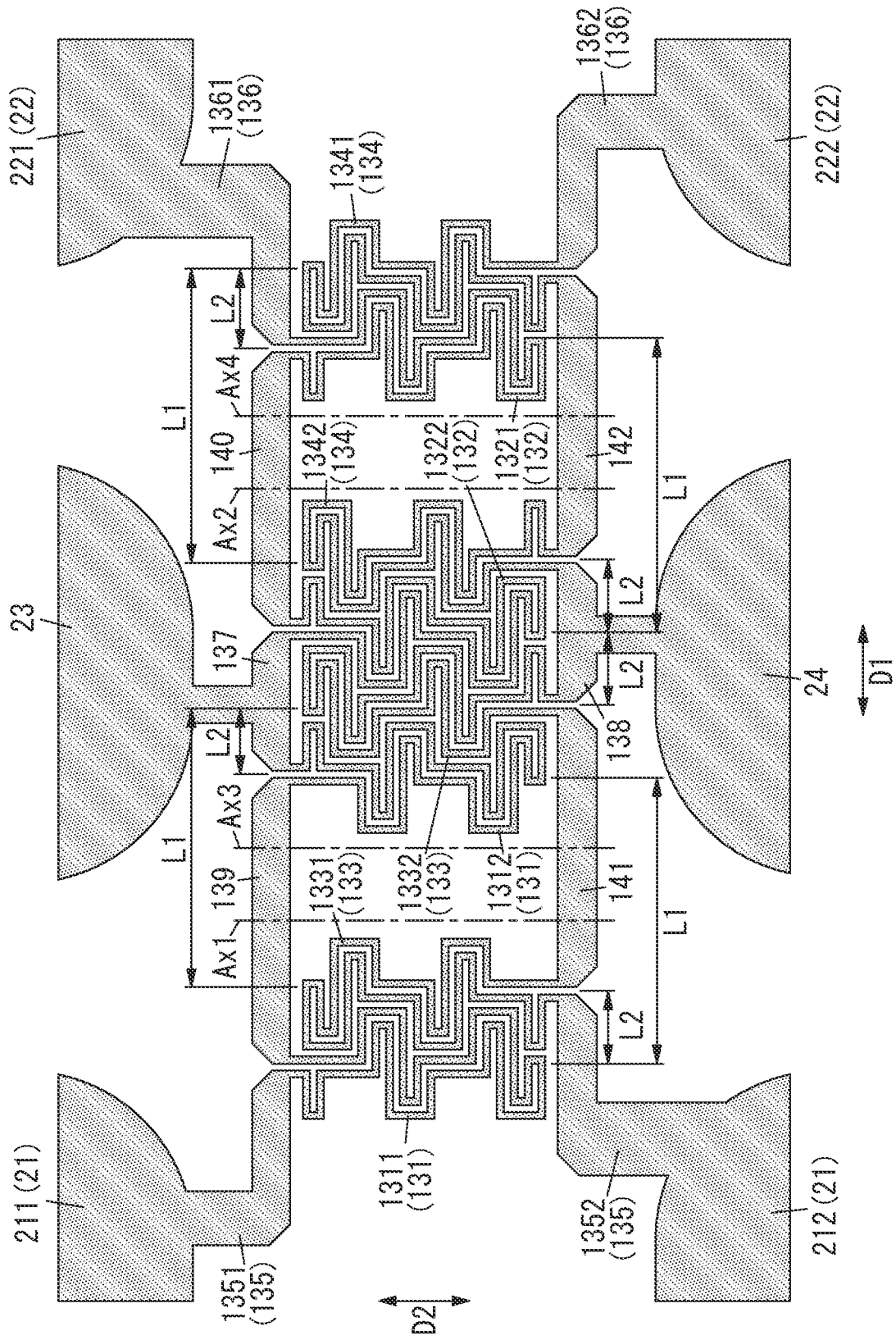
FIG. 5 illustrates an exemplary arrangement of magnetoresistance pattern portions, wiring pattern portions, and terminals in the magnetic sensor.

A magnetic sensor 1 according to the exemplary embodiment is configured to detect the position of a detection target 2 based on a change in magnetic field strength to be caused by relative movement of the detection target 2 in a first direction D1. The detection target 2 is magnetized in the first direction D1 in a predetermined cycle of magnetization λ. The magnetic sensor 1 includes a plurality of magnetoresistance pattern portions 131-134 as shown in FIG. 5. The plurality of magnetoresistance pattern portions 131-134 forms a bridge circuit. The plurality of magnetoresistance pattern portions 131-134 are arranged side by side in the first direction D1.

Each of the plurality of magnetoresistance pattern portions 131-134 includes a first resistance portion 1311, 1321, 1331, 1341 and a second resistance portion 1312, 1322, 1332, 1342 that are connected together in series as shown in FIG. 5. Each of the first resistance portions 1311, 1321, 1331, 1341 and the second resistance portions 1312, 1322, 1332, 1342 is formed in a second direction D2. The second direction D2 is perpendicular to the first direction D1.

In each of the plurality of magnetoresistance pattern portions 131-134, the first resistance portion 1311, 1321, 1331, 1341 and the second resistance portion 1312, 1322, 1332, 1342 are spaced from each other in the first direction D1 by a first distance L1 as shown in FIG. 5. The first distance L1 is one half as long as the cycle of magnetization λ. In each of the plurality of magnetoresistance pattern portions 131-134, the first resistance portion 1311, 1321, 1331, 1341 and the second resistance portion 1312, 1322, 1332, 1342 are symmetric to each other with respect to a line when viewed in plan in a third direction D3 as shown in FIG. 5. The third direction D3 is perpendicular to both the first direction D1 and the second direction D2. As used herein, if something is "aligned with the first direction or the second direction," this expression refers to not only a situation where the thing is parallel to the first direction or the second direction but also a situation where the thing forms a predetermined angle (of 5 degrees, for example) with respect to either the first direction or the second direction.

In the magnetic sensor 1 according to this embodiment, in each of the plurality of magnetoresistance pattern portions 131-134, the first resistance portion 1311, 1321, 1331, 1341 and the second resistance portion 1312, 1322, 1332, 1342 are spaced from each other in the first direction D1 by the first distance L1. In addition, in the magnetic sensor 1 according to this embodiment, in each of the plurality of magnetoresistance pattern portions 131-134, the first resistance portion 1311, 1321, 1331, 1341 and the second resistance portion 1312, 1322, 1332, 1342 are symmetric to each other with respect to a line when viewed in plan in the third direction D3. These configurations allow the magnetic sensor 1 to operate to cancel a dispersion in magnetic sensitivity distribution of the patterns of the respective resistance portions in the first direction D1 and a dispersion in the magnetization interval of the detection target. Consequently, the magnetic sensor 1 may reduce the chances of causing a decline in the positioning accuracy of the detection target 2.

(2) Details

Next, the magnetic sensor 1 according to this embodiment will be described in further detail with reference to FIGS. 1-5.

(2.1) Structure of Magnetic Sensor

First, the structure of the magnetic sensor 1 according to this embodiment will be described with reference to FIGS. 1 and 2.

Figure 1:
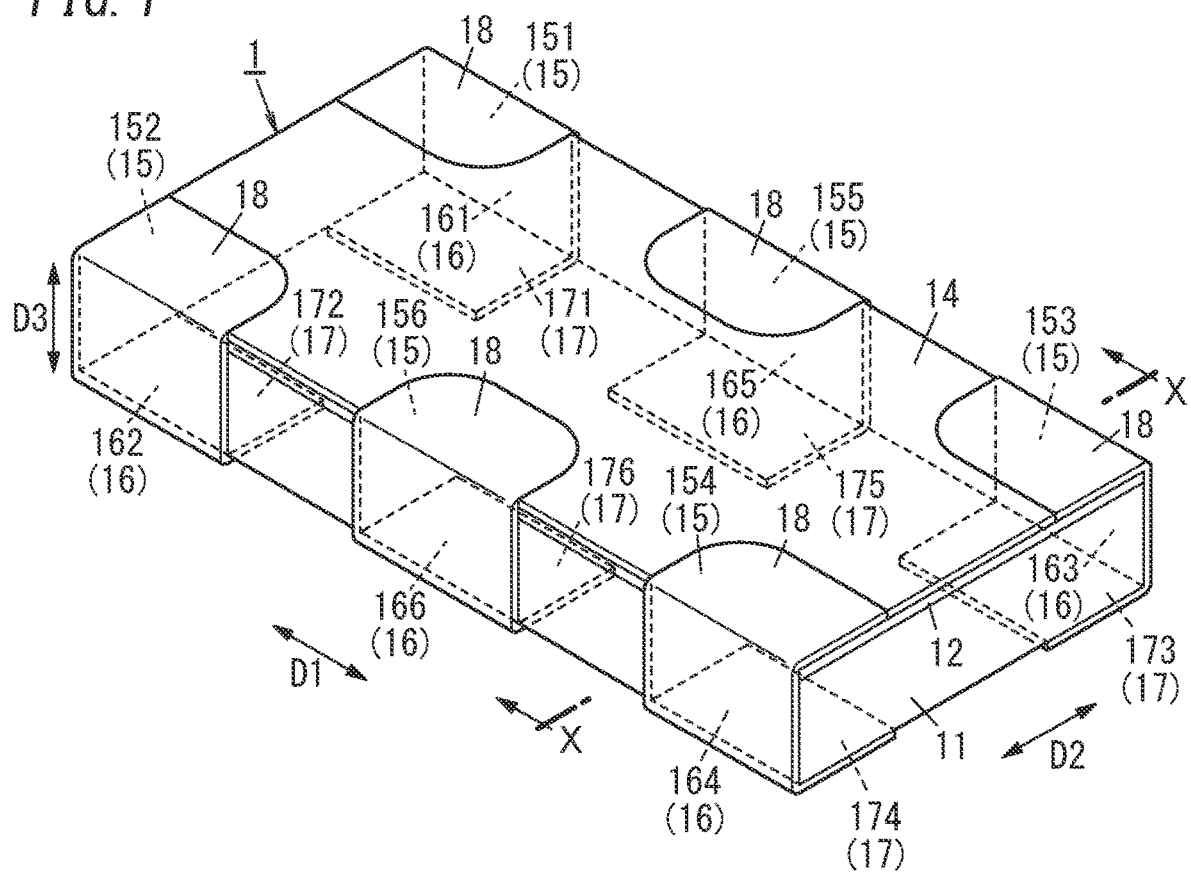
FIG. 1 is a perspective view illustrating the appearance of a magnetic sensor according to an embodiment.
Figure 2:
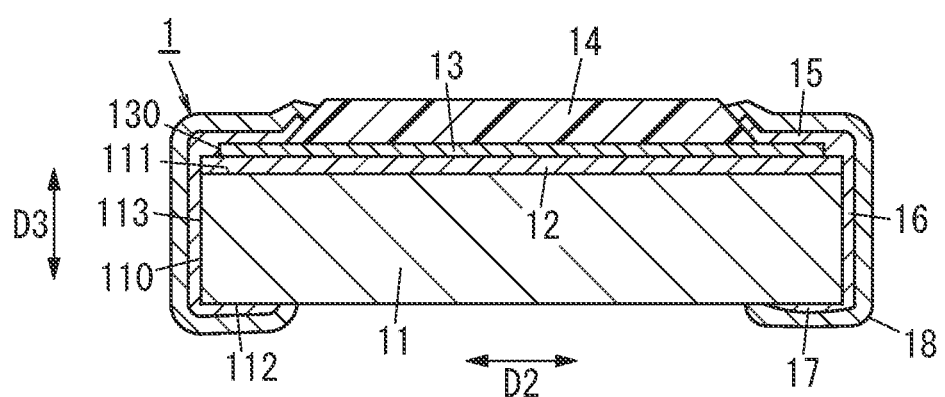
FIG. 2 is a cross-sectional view of the magnetic sensor as taken along a plane X-X shown in FIG. 1.
Figure 3:
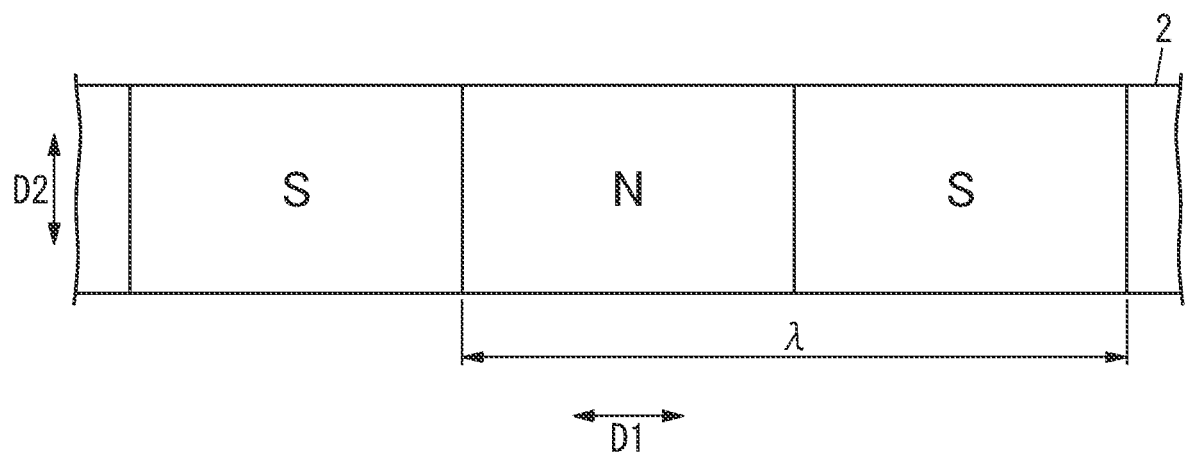
FIG. 3 schematically illustrates a configuration for a detection target for the magnetic sensor.

The magnetic sensor 1 according to this embodiment is formed in the shape of a rectangular parallelepiped elongate in the first direction D1 as shown in FIGS. 1 and 2. In the following description, the first direction D1 is defined by the longitudinal axis (i.e., length) of the magnetic sensor 1, a second direction D2 is defined by the latitudinal axis (i.e., width) of the magnetic sensor 1, and a third direction D3 is defined by the thickness of the magnetic sensor 1. However, these directions should not be construed as limiting the direction in which the magnetic sensor 1 should be used. Also, the arrows indicating these directions D1, D2, and D3 on the drawings are shown there only for illustrative purposes and are insubstantial ones. In this embodiment, the first direction D1 is a direction in which the magnetic sensor 1 moves with respect to the detection target 2. In this embodiment, the first direction D1, the second direction D2, and the third direction D3 intersect with each other at right angles.

The magnetic sensor 1 according to this embodiment includes a supporting substrate 11, a glass glazing layer 12, a magnetoresistive layer 13, and a protective coating 14 as shown in FIGS. 1 and 2. In addition, the magnetic sensor 1 according to this embodiment further includes a plurality of (e.g., six) upper surface electrodes 15, a plurality of (e.g., six) end face electrodes 16, a plurality of (e.g., six) lower surface electrodes (backside electrodes) 17, and a plurality of (e.g., six) plating layers 18. The plurality of upper surface electrodes 15, the plurality of end face electrodes 16, and the plurality of lower surface electrodes 17 correspond one to one to each other.

The supporting substrate 11 may be a ceramic substrate, for example. A material for the ceramic substrate may be, for example, sintered alumina, of which the content of alumina is equal to or greater than 96%. The supporting substrate 11 is formed in the shape of a rectangular plate which is elongate in the first direction D1 defined by the longitudinal axis of the magnetic sensor 1 when viewed in the third direction D3 defined by the thickness of the magnetic sensor 1. As shown in FIG. 2, the supporting substrate 11 has a first principal surface 111, a second principal surface 112, and outer peripheral surfaces 113. Each of the first principal surface 111 and the second principal surface 112 is a planar surface aligned with both the first direction D1 and the second direction D2. The first principal surface 111 and the second principal surface 112 face each other in the third direction D3. The outer peripheral surfaces 113 are planar surfaces aligned with the third direction D3.

The glass glazing layer 12 may contain, for example, silicon dioxide as a main component thereof. The glass glazing layer 12 is formed on the first principal surface 111 of the supporting substrate 11. Specifically, the glass glazing layer 12 is formed over the entire first principal surface 111 of the supporting substrate 11. The glass glazing layer 12 is formed in the shape of a rectangular layer which is elongate in the first direction D1 when viewed in the third direction D3. In the magnetic sensor 1 according to this embodiment, the glass glazing layer 12 makes the planar surface, on which the magnetoresistive layer 13 is formed, sufficiently smooth. Note that the glass glazing layer 12 only needs to be provided in a region where the plurality of magnetoresistance pattern portions 131-134 (to be described later) are arranged. Optionally, the glass glazing layer 12 may include a lead oxide.

The magnetoresistive layer 13 is formed on the glass glazing layer 12 as shown in FIG. 2. The magnetoresistive layer 13 includes a plurality of first layers and a plurality of second layers. Each of the plurality of first layers is a magnetic layer and may contain, for example, an NiFeCo alloy. Each of the plurality of second layers is a non-magnetic layer and may contain, for example, a Cu alloy. The plurality of first layers and the plurality of second layers are alternately stacked one on top of another on the glass glazing layer 12. In the magnetic sensor 1 according to this embodiment, a giant magnetoresistive (GMR) film is formed by the magnetoresistive layer 13. The number of the first layers provided may be the same as, or different from, the number of the second layers provided, whichever is appropriate. In the magnetic sensor 1 according to this embodiment, when viewed in plan in the third direction D3, the outer edges 130 of the magnetoresistive layer 13 are located inside the outer edges 110 of the supporting substrate 11 (refer to FIG. 2).

The protective coating 14 is a coating for protecting the magnetoresistive layer 13. A material for the protective coating 14 may be an epoxy resin, for example. The protective coating 14 is formed over the glass glazing layer 12 to cover the magnetoresistive layer 13 partially. In the magnetic sensor 1 according to this embodiment, the power supply terminal 21 and the ground terminal 22 (to be described later) and the first output terminal 23 and the second output terminal 24 (refer to FIGS. 4 and 5) are each connected to any of the plurality of upper surface electrodes 15. Thus, the protective coating 14 is provided to cover the magnetoresistive layer 13 entirely but at least the power supply terminal 21, the ground terminal 22, the first output terminal 23, and the second output terminal 24.

The plurality of upper surface electrodes 15 are formed on the first principal surface 111 (refer to FIG. 2) of the supporting substrate 11 as shown in FIG. 1. A material for the plurality of upper surface electrodes 15 may be, for example, a CuNi (copper-nickel) based alloy. The plurality of upper surface electrodes 15 includes a first upper surface electrode 151, a second upper surface electrode 152, a third upper surface electrode 153, a fourth upper surface electrode 154, a fifth upper surface electrode 155, and a sixth upper surface electrode 156. Each of the plurality of upper surface electrodes 15 is connected to any of the power supply terminal 21, the ground terminal 22, the first output terminal 23, or the second output terminal 24 in the magnetoresistive layer 13. More specifically, among the plurality of upper surface electrodes 15, the first upper surface electrode 151 and the second upper surface electrode 152 are connected to the power supply terminal 21. The third upper surface electrode 153 and the fourth upper surface electrode 154 are connected to the ground terminal 22. Also, among the plurality of upper surface electrodes 15, the fifth upper surface electrode 155 is connected to the first output terminal 23. The sixth upper surface electrode 156 is connected to the second output terminal 24. The plurality of upper surface electrodes 15 may be, for example, a sputtered film formed by sputtering.

The plurality of end face electrodes 16 is formed to cover two outer peripheral surfaces 113 (refer to FIG. 2), which are aligned with the longitudinal axis of the supporting substrate 11, along the longitudinal axis of the supporting substrate 11 (i.e., in the first direction D1) as shown in FIG. 1. A material for the plurality of end face electrodes 16 may be, for example, a CuNi (copper-nickel) based alloy. The plurality of end face electrodes 16 includes a first end face electrode 161, a second end face electrode 162, a third end face electrode 163, a fourth end face electrode 164, a fifth end face electrode 165, and a sixth end face electrode 166. The plurality of end face electrodes 16 correspond one to one to the plurality of upper surface electrodes 15 as described above. More specifically, the first end face electrode 161 corresponds to, and is connected to, the first upper surface electrode 151. The second end face electrode 162 corresponds to, and is connected to, the second upper surface electrode 152. The third end face electrode 163 corresponds to, and is connected to, the third upper surface electrode 153. The fourth end face electrode 164 corresponds to, and is connected to, the fourth upper surface electrode 154. The fifth end face electrode 165 corresponds to, and is connected to, the fifth upper surface electrode 155. The sixth end face electrode 166 corresponds to, and is connected to, the sixth upper surface electrode 156. The plurality of end face electrodes 16 may be, for example, a sputtered film formed by sputtering.

The plurality of lower surface electrodes 17 is formed on the second principal surface 112 (refer to FIG. 2) of the supporting substrate 11 as shown in FIG. 1. A material for the plurality of lower surface electrodes 17 may be, for example, a CuNi (copper-nickel) based alloy. The plurality of lower surface electrodes 17 includes a first lower surface electrode 171, a second lower surface electrode 172, a third lower surface electrode 173, a fourth lower surface electrode 174, a fifth lower surface electrode 175, and a sixth lower surface electrode 176. The plurality of lower surface electrodes 17 correspond one to one to the plurality of upper surface electrodes 15 and the plurality of end face electrodes 16 as described above. More specifically, the first lower surface electrode 171 corresponds to the first upper surface electrode 151 and the first end face electrode 161 and is connected to the first end face electrode 161. The second lower surface electrode 172 corresponds to the second upper surface electrode 152 and the second end face electrode 162 and is connected to the second end face electrode 162. The third lower surface electrode 173 corresponds to the third upper surface electrode 153 and the third end face electrode 163 and is connected to the third end face electrode 163. The fourth lower surface electrode 174 corresponds to the fourth upper surface electrode 154 and the fourth end face electrode 164 and is connected to the fourth end face electrode 164. The fifth lower surface electrode 175 corresponds to the fifth upper surface electrode 155 and the fifth end face electrode 165 and is connected to the fifth end face electrode 165. The sixth lower surface electrode 176 corresponds to the sixth upper surface electrode 156 and the sixth end face electrode 166 and is connected to the sixth end face electrode 166. The plurality of lower surface electrodes 17 may be, for example, a sputtered film formed by sputtering.

In the magnetic sensor 1 according to this embodiment, the first upper surface electrode 151, the first end face electrode 161, and the first lower surface electrode 171 (hereinafter referred to as "first electrodes") are formed in a U-shape when viewed in the first direction D1. The second upper surface electrode 152, the second end face electrode 162, and the second lower surface electrode 172 (hereinafter referred to as "second electrodes") are formed in a U-shape when viewed in the first direction D1. The third upper surface electrode 153, the third end face electrode 163, and the third lower surface electrode 173 (hereinafter referred to as "third electrodes") are formed in a U-shape when viewed in the first direction D1. The fourth upper surface electrode 154, the fourth end face electrode 164, and the fourth lower surface electrode 174 (hereinafter referred to as "fourth electrodes") are formed in a U-shape when viewed in the first direction D1. The fifth upper surface electrode 155, the fifth end face electrode 165, and the fifth lower surface electrode 175 (hereinafter referred to as "fifth electrodes") are formed in a U-shape when viewed in the first direction D1. The sixth upper surface electrode 156, the sixth end face electrode 166, and the sixth lower surface electrode 176 (hereinafter referred to as "sixth electrodes") are formed in a U-shape when viewed in the first direction D1.

Also, in the magnetic sensor 1 according to this embodiment, the fifth electrodes are located between the first electrodes and the third electrodes in the first direction D1. Furthermore, in the magnetic sensor 1 according to this embodiment, the sixth electrodes are located between the second electrodes and the fourth electrodes in the first direction D1.

The magnetic sensor 1 according to this embodiment may be connected to a mount board, on which the magnetic sensor 1 is going to be mounted, via the plurality of lower surface electrodes 17.

Each of the plurality of plating layers 18 is formed to cover a corresponding one of the plurality of upper surface electrodes 15, a corresponding one of the plurality of end face electrodes 16, and a corresponding one of the plurality of lower surface electrodes 17 as shown in FIG. 1. That is to say, each of the plurality of plating layers 18 is formed in a U-shape when viewed in the first direction D1. Each of the plurality of plating layers 18 includes, for example, an electroplated copper layer and an electroplated tin layer. That is to say, each of the plurality of plating layers 18 is a non-magnetic plating layer. Each of the plurality of plating layers 18 is in contact with the protective coating 14 as shown in FIG. 2.

(2.2) Structure of Detection Target

Next, the structure of the detection target 2 will be described with reference to FIG. 3.

The detection target 2 may be a magnetic scale, for example. The detection target 2 is formed in the shape of a plate which is elongate in the first direction D1 as shown in FIG. 3. The detection target 2 faces the magnetic sensor 1 in the third direction D3 (i.e., the direction perpendicular to the paper sheet on which FIG. 3 is drawn).

The detection target 2 includes a plurality of magnetic poles. The plurality of magnetic poles are arranged in the first direction D1. The plurality of magnetic poles includes one or more N poles and one or more S poles. The plurality of magnetic poles are arranged such that the one or more S poles and the one or more N poles are alternately arranged in the first direction D1. Each magnetic pole may be, for example, a ferrite magnet or a neodymium magnet. The detection target 2 includes a plurality of ferrite magnets or a plurality of neodymium magnets which are arranged in the first direction D1. The detection target 2 is magnetized in the first direction D1 in a cycle of magnetization $\lambda$ as shown in FIG. 3.

(2.3) Circuit Configuration for Magnetic Sensor

Next, a circuit configuration for the magnetic sensor 1 according to this embodiment will be described with reference to FIG. 4.

Figure 4:
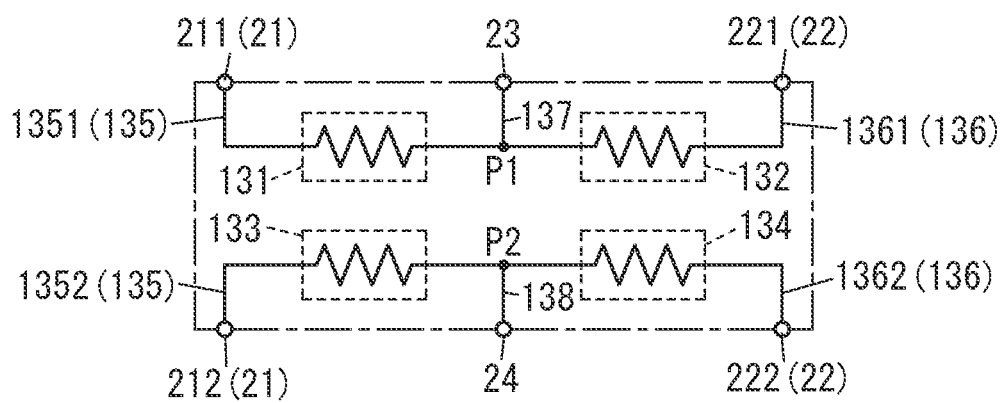
FIG. 4 is a schematic circuit diagram of the magnetic sensor.

The magnetic sensor 1 according to this embodiment includes the plurality of (e.g., four) magnetoresistance pattern portions 131-134, the first wiring pattern portion 135, the second wiring pattern portion 136, a third wiring pattern portion 137, and a fourth wiring pattern portion 138 as shown in FIG. 4. In addition, the magnetic sensor 1 according to this embodiment further includes a plurality of (e.g., two) power supply terminals 21, a plurality of (e.g., two) ground terminal 22, the first output terminal 23, and the second output terminal 24. In the following description, when the plurality of power supply terminals 21 need to be distinguished from each other, the plurality of power supply terminals 21 will be hereinafter referred to as a "first power supply terminal 211" and a "second power supply terminal 212," respectively. Also, when the plurality of ground terminals 22 need to be distinguished from each other, the plurality of ground terminals 22 will be hereinafter referred to as a "first ground terminal 221" and a "second ground terminal 222," respectively.

The magnetic sensor 1 according to this embodiment includes four magnetoresistance pattern portions 131-134 as the plurality of magnetoresistance pattern portions 131-134. The four magnetoresistance pattern portions 131-134 consist of a first magnetoresistance pattern portion 131, a second magnetoresistance pattern portion 132, a third magnetoresistance pattern portion 133, and a fourth magnetoresistance pattern portion 134. The first wiring pattern portion 135 includes a first wiring portion 1351 and a second wiring portion 1352. The second wiring pattern portion 136 includes a third wiring portion 1361 and a fourth wiring portion 1362.

The first magnetoresistance pattern portion 131, the second magnetoresistance pattern portion 132, the third magnetoresistance pattern portion 133, and the fourth magnetoresistance pattern portion 134 form a full bridge circuit. Specifically, a series circuit of the first magnetoresistance pattern portion 131 and the second magnetoresistance pattern portion 132 and a series circuit of the third magnetoresistance pattern portion 133 and the fourth magnetoresistance pattern portion 134 are connected to each other in parallel. In other words, the plurality of magnetoresistance pattern portions 131-134 is made up of the first magnetoresistance pattern portion 131 and second magnetoresistance pattern portion 132 that are connected together in series and the third magnetoresistance pattern portion 133 and fourth magnetoresistance pattern portion 134 that are connected together in series.

A connection node P1 between the first magnetoresistance pattern portion 131 and the second magnetoresistance pattern portion 132 is connected to the first output terminal 23 via the third wiring pattern portion 137. That is to say, the third wiring pattern portion 137 connected to the first output terminal 23 is connected to the first magnetoresistance pattern portion 131 and the second magnetoresistance pattern portion 132 that are connected together in series among the four magnetoresistance pattern portions 131-134.

The other end portion (i.e., the left end portion in FIG. 4), located opposite from one end portion thereof adjacent to the second magnetoresistance pattern portion 132, of the first magnetoresistance pattern portion 131 is connected to the first power supply terminal 211 via the first wiring portion 1351 of the first wiring pattern portion 135. That is to say, the first wiring pattern portion 135 is connected to the power supply terminal 21. In summary, the first magnetoresistance pattern portion 131 has a first end portion connected to the first power supply terminal 211 and a second end portion connected to the second magnetoresistance pattern portion 132 and the first output terminal 23.

The other end portion (i.e., the right end portion in FIG. 4), located opposite from one end portion thereof adjacent to the first magnetoresistance pattern portion 131, of the second magnetoresistance pattern portion 132 is connected to the first ground terminal 221 via the third wiring portion 1361 of second wiring pattern portion 136. That is to say, the second wiring pattern portion 136 is connected to the ground terminal 22. In summary, the second magnetoresistance pattern portion 132 has a first end portion connected to the second ground terminal 221 and a second end portion connected to the first magnetoresistance pattern portion 131 and the first output terminal 23.

A connection node P2 between the third magnetoresistance pattern portion 133 and the fourth magnetoresistance pattern portion 134 is connected to the second output terminal 24 via the fourth wiring pattern portion 138. That is to say, the fourth wiring pattern portion 138 connected to the second output terminal 24 is connected to the third magnetoresistance pattern portion 133 and fourth magnetoresistance pattern portion 134 that are connected together in series among the four magnetoresistance pattern portions 131-134.

The other end portion (i.e., the left end portion in FIG. 4), located opposite from one end portion thereof adjacent to the fourth magnetoresistance pattern portion 134, of the third magnetoresistance pattern portion 133 is connected to the second power supply terminal 212 via the second wiring portion 1352 of the first wiring pattern portion 135. In summary, the third magnetoresistance pattern portion 133 has a first end portion connected to the second power supply terminal 212 and a second end portion connected to the fourth magnetoresistance pattern portion 134 and the second output terminal 24.

The other end portion (i.e., the right end portion in FIG. 4), located opposite from one end portion thereof adjacent to the third magnetoresistance pattern portion 133, of the fourth magnetoresistance pattern portion 134 is connected to the second ground terminal 222 via the fourth wiring portion 1362 of the second wiring pattern portion 136. In summary, the fourth magnetoresistance pattern portion 134 has a first end portion connected to the second ground terminal 222 and a second end portion connected to the third magnetoresistance pattern portion 133 and the second output terminal 24.

The power supply terminals 21 (namely, the first power supply terminal 211 and the second power supply terminal 212), the ground terminals 22 (namely, the first ground terminal 221 and the second ground terminal 222), the first output terminal 23, and the second output terminal 24 correspond one to one to plurality of upper surface electrodes 15. Specifically, the first power supply terminal 211 corresponds one to one to, and is connected to, the first upper surface electrode 151 out of the plurality of upper surface electrodes 15. The second power supply terminal 212 corresponds one to one to, and is connected to, the second upper surface electrode 152 out of the plurality of upper surface electrodes 15. The first ground terminal 221 corresponds one to one to, and is connected to, the third upper surface electrode 153 out of the plurality of upper surface electrodes 15. The second ground terminal 222 corresponds one to one to, and is connected to, the fourth upper surface electrode 154 out of the plurality of upper surface electrodes 15. The first output terminal 23 corresponds one to one to, and is connected to, the fifth upper surface electrode 155 out of the plurality of upper surface electrodes 15. The second output terminal 24 corresponds one to one to, and is connected to, the sixth upper surface electrode 156 out of the plurality of upper surface electrodes 15.

(2.4) Exemplary Arrangement of Magnetoresistance Pattern Portions, Wiring Pattern Portions, and Terminals Next, an exemplary arrangement of the plurality of magnetoresistance pattern portions 131-134, the first to fourth wiring pattern portions 135-138, and the four terminals 21-24 in the magnetic sensor 1 according to this embodiment will be described with reference to FIG. 5. In FIG. 5, the magnetoresistance pattern portions 131-134, the first to fourth wiring pattern portions 135-138, and the four terminals 21-24 are shaded by dot hatching to be easily distinguished. In addition, in FIG. 5, first to fourth connection pattern portions 139-142 (to be described later) are also shaded by dot hatching to be easily distinguished.

The plurality of magnetoresistance pattern portions 131-134 are arranged side by side in the first direction D1 defined by the longitudinal axis of the magnetic sensor 1 as shown in FIG. The plurality of magnetoresistance pattern portions 131-134 includes the first magnetoresistance pattern portion 131, the second magnetoresistance pattern portion 132, the third magnetoresistance pattern portion 133, and the fourth magnetoresistance pattern portion 134 as described above.

The first magnetoresistance pattern portion 131 includes a first resistance portion 1311 and a second resistance portion 1312 as shown in FIG. 5. The first resistance portion 1311 and the second resistance portion 1312 are connected together in series via a first connection pattern portion 139 which is elongate in the first direction D1. Each of the first resistance portion 1311 and the second resistance portion 1312 is formed in a meandering shape when viewed in the third direction D3 (refer to FIG. 1). That is to say, each of the first resistance portion 1311 and the second resistance portion 1312 is formed in the shape of a river that meanders in the first direction D1 and the second direction D2 when viewed in the third direction D3. Each of the first resistance portion 1311 and the second resistance portion 1312 is formed in the second direction D2. That is to say, the longitudinal axis of each of the first resistance portion 1311 and the second resistance portion 1312 is aligned with the second direction D2.

The second magnetoresistance pattern portion 132 includes a first resistance portion 1321 and a second resistance portion 1322 as shown in FIG. 5. The first resistance portion 1321 and the second resistance portion 1322 are connected together in series via a second connection pattern portion 140 which is elongate in the first direction D1. Each of the first resistance portion 1321 and the second resistance portion 1322 is formed in a meandering shape when viewed in the third direction D3. That is to say, each of the first resistance portion 1321 and the second resistance portion 1322 is formed in the shape of a river that meanders in the first direction D1 and the second direction D2 when viewed in the third direction D3. Each of the first resistance portion 1321 and the second resistance portion 1322 is formed in the second direction D2. That is to say, the longitudinal axis of each of the first resistance portion 1321 and the second resistance portion 1322 is aligned with the second direction D2.

The third magnetoresistance pattern portion 133 includes a first resistance portion 1331 and a second resistance portion 1332 as shown in FIG. 5. The first resistance portion 1331 and the second resistance portion 1332 are connected together in series via a third connection pattern portion 141 which is elongate in the first direction D1. Each of the first resistance portion 1331 and the second resistance portion 1332 is formed in a meandering shape when viewed in the third direction D3. That is to say, each of the first resistance portion 1331 and the second resistance portion 1332 is formed in the shape of a river that meanders in the first direction D1 and the second direction D2 when viewed in the third direction D3. Each of the first resistance portion 1331 and the second resistance portion 1332 is formed in the second direction D2. That is to say, the longitudinal axis of each of the first resistance portion 1331 and the second resistance portion 1332 is aligned with the second direction D2.

The fourth magnetoresistance pattern portion 134 includes a first resistance portion 1341 and a second resistance portion 1342 as shown in FIG. 5. The first resistance portion 1341 and the second resistance portion 1342 are connected together in series via a fourth connection pattern portion 142 which is elongate in the first direction D1. Each of the first resistance portion 1341 and the second resistance portion 1342 is formed in a meandering shape when viewed in the third direction D3. That is to say, each of the first resistance portion 1341 and the second resistance portion 1342 is formed in the shape of a river that meanders in the first direction D1 and the second direction D2 when viewed in the third direction D3. Each of the first resistance portion 1341 and the second resistance portion 1342 is formed in the second direction D2. That is to say, the longitudinal axis of each of the first resistance portion 1341 and the second resistance portion 1342 is aligned with the second direction D2.

In the magnetic sensor 1 according to this embodiment, the plurality of magnetoresistance pattern portions 131-134 are arranged in the first direction D1 in the order of the first resistance portion 1311 of the first magnetoresistance pattern portion 131, the first resistance portion 1331 of the third magnetoresistance pattern portion 133, the second resistance portion 1312 of the first magnetoresistance pattern portion 131, the second resistance portion 1332 of the third magnetoresistance pattern portion 133, the second resistance portion 1322 of the second magnetoresistance pattern portion 132, the second resistance portion 1342 of the fourth magnetoresistance pattern portion 134, the first resistance portion 1321 of the second magnetoresistance pattern portion 132, and the first resistance portion 1341 of the fourth magnetoresistance pattern portion 134 from left to right as shown in FIG. 5.

The first wiring pattern portion 135 includes the first wiring portion 1351 and the second wiring portion 1352 as described above. The first wiring portion 1351 and the second wiring portion 1352 are each formed in an L-shape when viewed in the third direction D3. The first wiring portion 1351 connects the first power supply terminal 211 and the first resistance portion 1311 of the first magnetoresistance pattern portion 131 as shown in FIG. 5. The second wiring portion 1352 connects the second power supply terminal 212 and the first resistance portion 1331 of the third magnetoresistance pattern portion 133 as shown in FIG. 5. That is to say, the first wiring portion 1351 is connected to the first magnetoresistance pattern portion 131 and the second wiring portion 1352 is connected to the third magnetoresistance pattern portion 133.

The second wiring pattern portion 136 includes the third wiring portion 1361 and the fourth wiring portion 1362 as described above. The third wiring portion 1361 and the fourth wiring portion 1362 are each formed in an L-shape when viewed in the third direction D3. The third wiring portion 1361 connects the first ground terminal 221 and the first resistance portion 1321 of the second magnetoresistance pattern portion 132 as shown in FIG. 5. The fourth wiring portion 1362 connects the second ground terminal 222 and the first resistance portion 1341 of the fourth magnetoresistance pattern portion 134 as shown in FIG. 5. That is to say, the third wiring portion 1361 is connected to the second magnetoresistance pattern portion 132 and the fourth wiring portion 1362 is connected to the fourth magnetoresistance pattern portion 134.

The third wiring pattern portion 137 is formed in a T-shape when viewed in the third direction D3. The third wiring pattern portion 137 connects the first output terminal 23 to the second resistance portion 1312 of the first magnetoresistance pattern portion 131 and also connects the first output terminal 23 to the second resistance portion 1322 of the second magnetoresistance pattern portion 132 as shown in FIG. 5.

The fourth wiring pattern portion 138 is formed in a T-shape when viewed in the third direction D3. The fourth wiring pattern portion 138 connects the second output terminal 24 to the second resistance portion 1332 of the third magnetoresistance pattern portion 133 and also connects the second output terminal 24 to the second resistance portion 1342 of the fourth magnetoresistance pattern portion 134 as shown in FIG. 5.

In the magnetic sensor 1 according to this embodiment, the magnetoresistive layer 13 constitutes the first to fourth magnetoresistance pattern portions 131-134, the first to fourth wiring pattern portions 135-138, the plurality of terminals 21-24, and the first to fourth connection pattern portions 139-142. That is to say, in the magnetic sensor 1 according to this embodiment, the first to fourth wiring pattern portions 135-138, the plurality of terminals 21-24, and the first to fourth connection pattern portions 139-142 are made of the same material as the first to fourth magnetoresistance pattern portions 131-134.

In addition, in the magnetic sensor 1 according to this embodiment, the first wiring portion 1351 and the second wiring portion 1352 are respectively located, in the second direction D2, on both sides of the plurality of magnetoresistance pattern portions 131-134 as shown in FIG. 5. More specifically, the first wiring portion 1351 is located, in the upward/downward direction (i.e., the second direction D2), over the plurality of magnetoresistance pattern portions 131-134. The second wiring portion 1352 is located, in the upward/downward direction (i.e., the second direction D2), under the plurality of magnetoresistance pattern portions 131-134. That is to say, in the magnetic sensor 1 according to this embodiment, the first wiring portion 1351 that connects (the first resistance portion 1311 of) the first magnetoresistance pattern portion 131 to the first power supply terminal 211 and the second wiring portion 1352 that connects (the first resistance portion 1331 of) the third magnetoresistance pattern portion 133 to the second power supply terminal 212 are separately arranged, in the second direction D2, on both sides of the plurality of magnetoresistance pattern portions 131-134.

Furthermore, in the magnetic sensor 1 according to this embodiment, the third wiring portion 1361 and the fourth wiring portion 1362 are respectively located, in the second direction D2, on both sides of the plurality of magnetoresistance pattern portions 131-134 as shown in FIG. More specifically, the third wiring portion 1361 is located, in the upward/downward direction (i.e., the second direction D2), over the plurality of magnetoresistance pattern portions 131-134. The fourth wiring portion 1362 is located, in the upward/downward direction (i.e., the second direction D2), under the plurality of magnetoresistance pattern portions 131-134. That is to say, in the magnetic sensor 1 according to this embodiment, the third wiring portion 1361 that connects (the first resistance portion 1321 of) the second magnetoresistance pattern portion 132 to the first ground terminal 221 and the fourth wiring portion 1362 that connects (the first resistance portion 1341 of) the fourth magnetoresistance pattern portion 134 to the second ground terminal 222 are separately arranged, in the second direction D2, on both sides of the plurality of magnetoresistance pattern portions 131-134. This reduces the variation in the resistance value of the first wiring pattern portion 135 and the second wiring pattern portion 136 to be caused when the detection target 2 moves in the first direction D1. Consequently, this reduces the chances of causing a decline in the positioning accuracy of the detection target 2.

In this embodiment, as the magnetic sensor 1 moves in the first direction D1 with respect to the detection target 2, for example, the strength of the magnetic field between the magnetic sensor 1 and the detection target 2 changes. In response to this change in the magnetic field strength, the resistance values of the plurality of magnetoresistance pattern portions 131-134 vary. Then, the position of the detection target 2 may be detected by detecting potentials at the first output terminal 23 and the second output terminal 24. Note that the magnetic sensor 1 and the detection target 2 may be configured to move relative to each other. Thus, the magnetic sensor 1 and the detection target 2 may also be configured such that the detection target 2 moves relative to the magnetic sensor 1.

(2.5) Arrangement of Magnetoresistance Pattern Portions

Next, the arrangement of the plurality of magnetoresistance pattern portions 131-134 will be described with reference to FIG. 5.

In the example illustrated in FIG. 5, the plurality of magnetoresistance pattern portions 131-134 are arranged in the first direction D1 in the order of the first resistance portion 1311 of the first magnetoresistance pattern portion 131, the first resistance portion 1331 of the third magnetoresistance pattern portion 133, the second resistance portion 1312 of the first magnetoresistance pattern portion 131, the second resistance portion 1332 of the third magnetoresistance pattern portion 133, the second resistance portion 1322 of the second magnetoresistance pattern portion 132, the second resistance portion 1342 of the fourth magnetoresistance pattern portion 134, the first resistance portion 1321 of the second magnetoresistance pattern portion 132, and the first resistance portion 1341 of the fourth magnetoresistance pattern portion 134 from left to right.

In the first magnetoresistance pattern portion 131, the first resistance portion 1311 and the second resistance portion 1312 are symmetric to each other with respect to a line when viewed in plan in the third direction D3. As used herein, the expression "the first resistance portion and the second resistance portion are symmetric to each other with respect to a line" refers to not only a situation where the first resistance portion and the second resistance portion overlap with each other when folded over along an axis of symmetry aligned with the second direction D2 but also a situation where the first resistance portion and the second resistance portion are caused to overlap with each other by relative movement of the first resistance portion and the second resistance portion along an axis of symmetry when folded over along the axis of symmetry. Also, as used herein, the expression "the first resistance portion and the second resistance portion overlap with each other" refers to not only a situation where the first resistance portion and the second resistance portion overlap with each other completely but also a situation where the first resistance portion and the second resistance portion overlap with each other to the extent that variations in their resistance value in response to a change in magnetic field strength distribution may be regarded as the same behavior. In this case, the axis of symmetry is an axis substantially aligned with the second direction D2. That is to say, the axis of symmetry may naturally be parallel to the second direction D2 but may form a predetermined angle (of 5 degrees, for example) with respect to the second direction D2.

Furthermore, the first resistance portion 1311 and the second resistance portion 1312 have the same shape when viewed in plan in the third direction D3. As used herein, if two things "have the same shape," this expression refers to not only a situation where the two things have exactly the same shape but also a situation where their shapes are different to the extent that variations in their resistance value in response to a change in magnetic field strength distribution may be regarded as the same behavior. Therefore, the first resistance portion and the second resistance portion may have mutually different shapes as long as variations in their resistance value in response to a change in magnetic field strength distribution may be regarded as the same behavior. As can be seen, in this embodiment, the first resistance portion 1311 and second resistance portion 1312 of the first magnetoresistance pattern portion 131 not only are symmetric to each other with respect to an axis A×1 of symmetry but also have the same shape when viewed in plan in the third direction D3.

Furthermore, in the first magnetoresistance pattern portion 131, the first resistance portion 1311 and the second resistance portion 1312 are spaced from each other in the first direction D1 by a first distance L1. In the first magnetoresistance pattern portion 131, the first distance L1 is the distance between the center of the first resistance portion 1311 in the first direction D1 and the center of the second resistance portion 1312 in the first direction D1. In other words, the first distance L1 is the distance between the centerline of the first resistance portion 1311 in the first direction D1 and the centerline of the second resistance portion 1312 in the first direction D1. In this embodiment, the first distance L1 is one half as long as the cycle of magnetization λ of the detection target 2 and equal to the dimension of each magnetic pole of the detection target 2 as measured in the first direction D1.

In the second magnetoresistance pattern portion 132, the first resistance portion 1321 and the second resistance portion 1322 are symmetric to each other with respect to a line when viewed in plan in the third direction D3. In addition, the first resistance portion 1321 and the second resistance portion 1322 have the same shape when viewed in plan in the third direction D3. That is to say, in the second magnetoresistance pattern portion 132, the first resistance portion 1321 and the second resistance portion 1322 not only are symmetric to each other with respect to an axis A×2 of symmetry but also have the same shape when viewed in plan in the third direction D3.

Also, in the second magnetoresistance pattern portion 132, the first resistance portion 1321 and the second resistance portion 1322 are spaced from each other in the first direction D1 by a first distance L1. In the second magnetoresistance pattern portion 132, the first distance L1 is the distance between the center of the first resistance portion 1321 in the first direction D1 and the center of the second resistance portion 1322 in the first direction D1. In other words, the first distance L1 is the distance between the centerline of the first resistance portion 1321 in the first direction D1 and the centerline of the second resistance portion 1322 in the first direction D1.

In the third magnetoresistance pattern portion 133, the first resistance portion 1331 and the second portion 1332 are symmetric to each other with respect to a line when viewed in plan in the third direction D3. In addition, the first resistance portion 1331 and the second resistance portion 1332 have the same shape when viewed in plan in the third direction D3. That is to say, in the third magnetoresistance pattern portion 133, the first resistance portion 1331 and the second resistance portion 1332 not only are symmetric to each other with respect to an axis Ax3 of symmetry but also have the same shape when viewed in plan in the third direction D3.

Also, in the third magnetoresistance pattern portion 133, the first resistance portion 1331 and the second resistance portion 1332 are spaced from each other in the first direction D1 by a first distance L1. In the third magnetoresistance pattern portion 133, the first distance L1 is the distance between the center of the first resistance portion 1331 in the first direction D1 and the center of the second resistance portion 1332 in the first direction D1. In other words, the first distance L1 is the distance between the centerline of the first resistance portion 1331 in the first direction D1 and the centerline of the second resistance portion 1332 in the first direction D1.

In the fourth magnetoresistance pattern portion 134, the first resistance portion 1341 and the second resistance portion 1342 are symmetric to each other with respect to a line when viewed in plan in the third direction D3. In addition, the first resistance portion 1341 and the second resistance portion 1342 have the same shape when viewed in plan in the third direction D3. That is to say, in the fourth magnetoresistance pattern portion 134, the first resistance portion 1341 and the second resistance portion 1342 not only are symmetric to each other with respect to an axis Ax4 of symmetry but also have the same shape when viewed in plan in the third direction D3.

Also, in the fourth magnetoresistance pattern portion 134, the first resistance portion 1341 and the second resistance portion 1342 are spaced from each other in the first direction D1 by a first distance L1. In the fourth magnetoresistance pattern portion 134, the first distance L1 is the distance between the center of the first resistance portion 1341 in the first direction D1 and the center of the second resistance portion 1342 in the first direction D1. In other words, the first distance L1 is the distance between the centerline of the first resistance portion 1341 in the first direction D1 and the centerline of the second resistance portion 1342 in the first direction D1.

As can be seen, in each of the plurality of magnetoresistance pattern portions 131-134, the first resistance portion 1311, 1321, 1331, 1341 and the second resistance portion 1312, 1322, 1332, 1342 have a symmetric shape and are spaced from each other in the first direction D1 by the first distance L1 which is one half as long as the cycle of magnetization λ of the detection target 2. This reduces the chances of causing a decline in the positioning accuracy of the detection target 2. More specifically, this allows the magnetic sensor 1 to operate to cancel a dispersion in magnetic sensitivity distribution of the patterns of the respective resistance portions in the first direction D1 and a dispersion in the magnetization interval of the detection target 2. Consequently, the magnetic sensor 1 may reduce the chances of causing a decline in the positioning accuracy of the detection target 2.

Furthermore, in the example illustrated in FIG. 5, the first resistance portion 1311 of the first magnetoresistance pattern portion 131 and the first resistance portion 1331 of the third magnetoresistance pattern portion 133 are adjacent to each other in the first direction D1 and spaced from each other in the first direction D1 by a second distance L2. The second distance L2 may be, for example, one-eighth as long as the cycle of magnetization λ of the detection target 2. Furthermore, in the example illustrated in FIG. 5, the second resistance portion 1312 of the first magnetoresistance pattern portion 131 and the second resistance portion 1332 of the third magnetoresistance pattern portion 133 are adjacent to each other in the first direction D1 and spaced from each other in the first direction D1 by the second distance L2. Furthermore, in the example illustrated in FIG. 5, the second resistance portion 1332 of the third magnetoresistance pattern portion 133 and the second resistance portion 1322 of the second magnetoresistance pattern portion 132 are adjacent to each other in the first direction D1 and spaced from each other in the first direction D1 by the second distance L2. Furthermore, in the example illustrated in FIG. 5, the second resistance portion 1322 of the second magnetoresistance pattern portion 132 and the second resistance portion 1342 of the fourth magnetoresistance pattern portion 134 are adjacent to each other in the first direction D1 and spaced from each other in the first direction D1 by the second distance L2. Furthermore, in the example illustrated in FIG. 5, the first resistance portion 1321 of the second magnetoresistance pattern portion 132 and the first resistance portion 1341 of the fourth magnetoresistance pattern portion 134 are adjacent to each other in the first direction D1 and spaced from each other in the first direction D1 by the second distance L2.

Spacing either two adjacent first resistance portions or two adjacent second resistance portions from each other in the first direction D1 by the second distance L2, which is one-eighth as long as the cycle of magnetization λ of the detection target 2, in this manner contributes to downsizing the magnetic sensor 1.

(3) Method for Manufacturing Magnetic Sensor

Next, a method for manufacturing a magnetic sensor 1 according to this embodiment will be described.

The method for manufacturing the magnetic sensor 1 includes the following first through ninth steps.

A first step includes providing a supporting substrate 11. More specifically, the first step includes providing a wafer, which forms the basis of respective supporting substrates 11 of a plurality of magnetic sensors 1. The wafer may be a ceramic wafer, for example. A material for the ceramic wafer used as an exemplary wafer may be, for example, sintered alumina, of which the content of alumina is equal to or greater than 96%.

A second step includes forming a glass glazing layer 12 on the first principal surface of the wafer. The first principal surface of the wafer is a surface that will be the first principal surface 111 of the supporting substrate 11 in each of the plurality of magnetic sensors 1. More specifically, the second step includes forming the glass glazing layer 12 by applying a glass paste onto the first principal surface 111 of the supporting substrate 11 and then firing the glass paste.

A third step includes forming a magnetoresistive layer 13 for the plurality of magnetic sensors 1. More specifically, the third step includes forming the magnetoresistive layer 13 on the glass glazing layer 12 by sputtering, for example. In the magnetic sensor 1 according to this embodiment, the magnetoresistive layer 13 is formed as a GMR film as described above by alternately stacking a plurality of NiFeCo alloy layers (first layers) and a plurality of Cu alloy layers (second layers).

A fourth step includes forming a protective coating 14. More specifically, the fourth step includes applying an epoxy resin by screen printing onto the glass glazing layer 12 such that the magnetoresistive layer 13 is partially covered with the epoxy resin and then thermally curing the epoxy resin, thereby forming the protective coating 14. In this process step, the protective coating 14 is formed to cover the magnetoresistive layer 13 entirely but at least the power supply terminals 21, the ground terminals 22, the first output terminal 23, and the second output terminal 24.

A fifth step includes forming a plurality of upper surface electrodes 15 on the first principal surface of the wafer for each of the plurality of magnetic sensors 1. More specifically, the fifth step includes forming a CuNi based alloy film on the first principal surface of the wafer by sputtering, for example, thereby forming the plurality of upper surface electrodes 15 for each of the plurality of magnetic sensors 1.

A sixth step includes forming a plurality of lower surface electrodes 17 on the second principal surface of the wafer for each of the plurality of magnetic sensors 1. More specifically, the sixth step includes forming a CuNi based alloy film on the second principal surface of the wafer by sputtering, for example, thereby forming the plurality of lower surface electrodes 17 for each of the plurality of magnetic sensors 1. The second principal surface of the wafer is a surface that will be the second principal surface 112 of the supporting substrate 11 in each of the plurality of magnetic sensors 1.

A seventh step includes cutting off the assembly of the plurality of magnetic sensors 1 that have been formed integrally by performing the first through sixth steps into respective magnetic sensors 1. More specifically, the seventh step includes cutting off, by laser cutting or dicing, for example, the assembly of the plurality of magnetic sensors 1 that have been formed integrally into respective magnetic sensors 1.

An eighth step includes forming a plurality of end face electrodes 16 on each magnetic sensor 1 that has been cut off. More specifically, the eighth step includes forming a CuNi based alloy film on the outer peripheral surfaces 113 of the supporting substrate 11 by sputtering, for example, thereby forming a plurality of end face electrodes 16 on each of the plurality of magnetic sensors 1. This allows the plurality of upper surface electrodes 15 and the plurality of lower surface electrodes 17 to be connected together via the plurality of end face electrodes 16.

A ninth step includes forming plating layers 18 on each of the plurality of magnetic sensors 1. More specifically, the ninth step includes sequentially forming an electroplated copper layer and an electroplated tin layer as the plating layers 18 with respect to each of the plurality of magnetic sensors 1.

The magnetic sensor 1 according to this embodiment may be manufactured by performing the first through ninth steps described above.

(4) Advantages

As described above, in the magnetic sensor 1 according to this embodiment, in each of the plurality of magnetoresistance pattern portions 131-134, the first resistance portion 1311, 1321, 1331, 1341 and the second resistance portion 1312, 1322, 1332, 1342 are spaced from each other in the first direction D1 by the first distance L1. In addition, in the magnetic sensor 1 according to this embodiment, in each of the plurality of magnetoresistance pattern portions 131-134, the first resistance portion 1311, 1321, 1331, 1341 and the second resistance portion 1312, 1322, 1332, 1342 are symmetric to each other with respect to a line when viewed in plan in the third direction D3. These configurations allow the magnetic sensor 1 to operate to cancel a dispersion in magnetic sensitivity distribution of the patterns of the respective resistance portions in the first direction D1 and a dispersion in the magnetization interval of the detection target 2. Consequently, the magnetic sensor 1 may reduce the chances of causing a decline in the positioning accuracy of the detection target 2.

In addition, in the magnetic sensor 1 according to this embodiment, when measured in the first direction D1, the second distance L2 between two adjacent first resistance portions and the second distance L2 between two adjacent second resistance portions among the plurality of first resistance portions 1311, 1321, 1331, 1341 and the plurality of second resistance portions 1312, 1322, 1332, 1342 in the plurality of magnetoresistance pattern portions 131-134 are each one-eighth as long as the cycle of magnetization λ of the detection target 2 as described above. This contributes to downsizing the magnetic sensor 1.

Furthermore, in the magnetic sensor 1 according to this embodiment, each of the plurality of first resistance portions 1311, 1321, 1331, 1341 and the plurality of second resistance portions 1312, 1322, 1332, 1342 has a meandering shape when viewed in the third direction D3 as described above. This allows each of the plurality of resistance portions 1311, 1312, 1321, 1322, 1331, 1332, 1341, 1342 to have an equal length.

Furthermore, in the magnetic sensor 1 according to this embodiment, the first wiring portion 1351 connected to the first magnetoresistance pattern portion 131 is located, in the second direction D2, on one side of the plurality of magnetoresistance pattern portions 131-134. The second wiring portion 1352 connected to the third magnetoresistance pattern portion 133 is located, in the second direction D2, on the other side of the plurality of magnetoresistance pattern portions 131-134. The third wiring portion 1361 connected to the second magnetoresistance pattern portion 132 is located, in the second direction D2, on the one side of the plurality of magnetoresistance pattern portions 131-134. The fourth wiring portion 1362 connected to the fourth magnetoresistance pattern portion 134 is located, in the second direction D2, on the other side of the plurality of magnetoresistance pattern portions 131-134. This reduces the variation in the resistance value of the first wiring pattern portion 135 and the second wiring pattern portion 136 to be caused when the detection target 2 moves in the first direction D1. Consequently, this reduces the chances of causing a decline in the positioning accuracy of the detection target 2.

Furthermore, in the magnetic sensor 1 according to this embodiment, each of the first wiring pattern portion 135 and the second wiring pattern portion 136 is made of the same material as the plurality of magnetoresistance pattern portions 131-134 as described above. This allows the first wiring pattern portion 135, the second wiring pattern portion 136, and the plurality of magnetoresistance pattern portions 131-134 to be formed in the same manufacturing process step, thus reducing an increase in the number of manufacturing process steps. Therefore, the magnetic sensor 1 according to this embodiment may reduce the chances of causing a decline in the positioning accuracy of the detection target 2 while reducing an increase in the number of manufacturing process steps.

(5) Variations

Note that the embodiment described above is only an exemplary one of various embodiments of the present disclosure and should not be construed as limiting. Rather, the exemplary embodiment may be readily modified in various manners depending on a design choice or any other factor without departing from the scope of the present disclosure. Next, variations of the exemplary embodiment described above will be enumerated one after another. Note that the variations to be described below may be adopted in combination as appropriate.

The plurality of first resistance portions 1311, 1321, 1331, 1341 and the plurality of second resistance portions 1312, 1322, 1332, 1342 do not have to have the meandering shape but may have any other shape.

In the embodiment described above, each of the plurality of magnetoresistance pattern portions 131-134 consists of two resistance portions. Alternatively, each of the plurality of magnetoresistance pattern portions 131-134 may also consist of only one resistance portion or even three or more resistance portions.

In the embodiment described above, two adjacent first resistance portions and two adjacent second resistance portions are both spaced from each other by the second distance L2, which is one-eighth as long as the cycle of magnetization λ of the detection target 2. However, this is only an example and should not be construed as limiting. Alternatively, only two adjacent first resistance portions may be spaced from each other by the second distance L2. Still alternatively, only two adjacent second resistance portions may be spaced from each other by the second distance L2. That is to say, two adjacent first resistance portions and/or two adjacent second resistance portions may be spaced from each other by the second distance L2.

Furthermore, the second distance L2 does not have to be one-eighth of the cycle of magnetization λ of the detection target 2 but may be one quarter of the cycle of magnetization λ of the detection target 2 as well.

(Aspects)

The embodiments and their variations described above are specific implementations of the following aspects of the present disclosure.

A magnetic sensor (1) according to a first aspect detects a position of a detection target (2) based on a change in magnetic field strength to be caused by relative movement of the detection target (2) in a first direction (D1). The detection target (2) is magnetized in the first direction (D1) in a predetermined cycle of magnetization (λ). The magnetic sensor (1) includes a plurality of magnetoresistance pattern portions (131-134). The plurality of magnetoresistance pattern portions (131-134) forms a bridge circuit. The plurality of magnetoresistance pattern portions (131-134) are arranged side by side in the first direction (D1). Each of the plurality of magnetoresistance pattern portions (131-134) includes a first resistance portion (1311, 1321, 1331, 1341) and a second resistance portion (1312, 1322, 1332, 1342) that are connected together in series. Each of the first resistance portion (1311, 1321, 1331, 1341) and the second resistance portion (1312, 1322, 1332, 1342) is formed in a second direction (D2). The second direction (D2) is perpendicular to the first direction (D1). In each of the plurality of magnetoresistance pattern portions (131-134), the first resistance portion (1311, 1321, 1331, 1341) and the second resistance portion (1312, 1322, 1332, 1342) are spaced from each other in the first direction (D1) by a distance (L1) that is one half as long as the cycle of magnetization (λ). In each of the plurality of magnetoresistance pattern portions (131-134), the first resistance portion (1311, 1321, 1331, 1341) and the second resistance portion (1312, 1322, 1332, 1342) are symmetric to each other with respect to a line when viewed in plan in a third direction (D3). The third direction (D3) is perpendicular to both the first direction (D1) and the second direction (D2).

This aspect reduces the chances of causing a decline in the positioning accuracy of the detection target (2).

In a magnetic sensor (1) according to a second aspect, which may be implemented in conjunction with the first aspect, the plurality of magnetoresistance pattern portions (131-134) includes a plurality of the first resistance portions (1311, 1321, 1331, 1341) and a plurality of the second resistance portions (1312, 1322, 1332, 1342). Two out of the plurality of the first resistance portions (1311, 1321, 1331, 1341) are adjacent to each other. Two out of the plurality of the second resistance portions (1312, 1322, 1332, 1342) are respectively adjacent to the two first resistance portions. At least one of the two second resistance portions is spaced in the first direction (D1) from at least one of the two first resistance portions by a distance (L2) that is one-eighth as long as the cycle of magnetization (λ).

This aspect contributes to downsizing the magnetic sensor (1).

In a magnetic sensor (1) according to a third aspect, which may be implemented in conjunction with the first or second aspect, each of the plurality of the first resistance portions (1311, 1321, 1331, 1341) and the plurality of the second resistance portions (1312, 1322, 1332, 1342) included in the plurality of magnetoresistance pattern portions (131-134) is formed in a meandering shape when viewed in the third direction (D3).

This aspect allows the respective resistance portions (1311, 1312, 1321, 1322, 1331, 1332, 1341, 1342) to have an equal length.

A magnetic sensor (1) according to a fourth aspect, which may be implemented in conjunction with any one of the first to third aspects, includes four magnetoresistance pattern portions (131-134) as the plurality of magnetoresistance pattern portions (131-134). The four magnetoresistance pattern portions (131-134) form a full-bridge circuit as the bridge circuit.

A magnetic sensor (1) according to a fifth aspect, which may be implemented in conjunction with the fourth aspect, further includes a first wiring pattern portion (135), a second wiring pattern portion (136), a third wiring pattern portion (137), and a fourth wiring pattern portion (138). The first wiring pattern portion (135) is connected to a power supply terminal (21). The second wiring pattern portion (136) is connected to a ground terminal (22). The third wiring pattern portion (137) is connected to a first output terminal (23). The fourth wiring pattern portion (138) is connected to a second output terminal (24). The plurality of magnetoresistance pattern portions (131-134) includes: a first magnetoresistance pattern portion (131) and a second magnetoresistance pattern portion (132) which are connected together in series; and a third magnetoresistance pattern portion (133) and a fourth magnetoresistance pattern portion (134) which are connected together in series. The first wiring pattern portion (135) includes a first wiring portion (1351) and a second wiring portion (1352). To the first wiring portion (1351), one end portion of the first magnetoresistance pattern portion (131) is connected. The one end portion of the first magnetoresistance pattern portion (131) is opposite from the other end portion, adjacent to the second magnetoresistance pattern portion (132), of the first magnetoresistance pattern portion (131). To a second wiring portion (1352), one end portion of the third magnetoresistance pattern portion (133) is connected. The one end portion of the third magnetoresistance pattern portion (133) is opposite from the other end portion, adjacent to the fourth magnetoresistance pattern portion (134), of the third magnetoresistance pattern portion (133). The second wiring pattern portion (136) includes a third wiring portion (1361) and a fourth wiring portion (1362). To the third wiring portion (1361), one end portion of the second magnetoresistance pattern portion (132) is connected. The one end portion of the second magnetoresistance pattern portion (132) is opposite from the other end portion, adjacent to the first magnetoresistance pattern portion (131), of the second magnetoresistance pattern portion (132). To the fourth wiring portion (1362), one end portion of the fourth magnetoresistance pattern portion (134) is connected. The one end portion of the fourth magnetoresistance pattern portion (134) is opposite from the other end portion, adjacent to the third magnetoresistance pattern portion (133), of the fourth magnetoresistance pattern portion (134). The third wiring pattern portion (137) is connected to the first magnetoresistance pattern portion (131) and the second magnetoresistance pattern portion (132). The fourth wiring pattern portion (138) is connected to the third magnetoresistance pattern portion (133) and the fourth magnetoresistance pattern portion (134).

A magnetic sensor (1) according to a sixth aspect, which may be implemented in conjunction with any one of the first to fifth aspects, further includes a first wiring pattern portion (135), a second wiring pattern portion (136), a third wiring pattern portion (137), and a fourth wiring pattern portion (138). The first wiring pattern portion (135) is connected to a power supply terminal (21). The second wiring pattern portion (136) is connected to a ground terminal (22). The third wiring pattern portion (137) is connected to a first output terminal (23). The fourth wiring pattern portion (138) connected to a second output terminal (24). Each of the first wiring pattern portion (135), the second wiring pattern portion (136), the third wiring pattern portion (137), and the fourth wiring pattern portion (138) is made of the same material as the plurality of magnetoresistance pattern portions (131-134). The plurality of magnetoresistance pattern portions (131-134) includes: a first magnetoresistance pattern portion (131) and a second magnetoresistance pattern portion (132) which are connected together in series; and a third magnetoresistance pattern portion (133) and a fourth magnetoresistance pattern portion (134) which are connected together in series. The first wiring pattern portion (135) includes a first wiring portion (1351) and a second wiring portion (1352). The first wiring portion (1351) is connected to the first magnetoresistance pattern portion (131). The second wiring portion (1352) is connected to the third magnetoresistance pattern portion (133). The second wiring pattern portion (136) includes a third wiring portion (1361) and a fourth wiring portion (1362). The third wiring portion (1361) is connected to the second magnetoresistance pattern portion (132). The fourth wiring portion (1362) is connected to the fourth magnetoresistance pattern portion (134). The first output terminal (23) is connected to the first magnetoresistance pattern portion (131) and the second magnetoresistance pattern portion (132) via the third wiring pattern portion (137). The second output terminal (24) is connected to the third magnetoresistance pattern portion (133) and the fourth magnetoresistance pattern portion (134) via the fourth wiring pattern portion (138). The first wiring portion (1351) is located, in a second direction (D2) intersecting with the first direction (D1), on one side (on the upper side) of the plurality of magnetoresistance pattern portions (131-134). The second wiring portion (1352) is located, in the second direction (D2), on the other side (on the lower side) of the plurality of magnetoresistance pattern portions (131-134). The third wiring portion (1361) is located, in the second direction (D2), on the one side (on the upper side) of the plurality of magnetoresistance pattern portions (131-134). The fourth wiring portion (1362) is located, in the second direction (D2), on the other side (on the lower side) of the plurality of magnetoresistance pattern portions (131-134).

This aspect reduces the chances of causing a decline in the positioning accuracy of the detection target (2) while reducing an increase in the number of manufacturing process steps.

Note that the constituent elements according to the second to sixth aspects are not essential constituent elements for the magnetic sensor (1) but may be omitted as appropriate.

Patent Literature 2 discloses a magnetic sensor including a flexible assembly in which a magnetic detection unit, a thin film conductor (wiring pattern portion), and electrode terminals (including power supply terminals and ground terminals) are formed on a flexible substrate. The magnetic detection unit includes four patterns (magnetoresistance pattern portions) which are arranged side by side in a moving direction (first direction) of a magnetic medium (detection target). Two patterns, which are located at both ends in the moving direction, out of the four patterns each include an extended portion, which is extended outside of the pattern in a direction (second direction) intersecting with the moving direction and which forms part of the thin film conductor.

In the magnetic sensor of Patent Literature 2, if the thin film conductor is made of the same material as the four patterns, for example, the resistance value of the extended portions of the thin film conductor varies as the magnetic medium moves in the moving direction, thus causing a decline in the positioning accuracy of the magnetic medium. Nevertheless, if the thin film conductor is made of a material with no magnetoresistance effects, which is different from the material of the four patterns, to reduce the chances of causing a decline in the positioning accuracy of the magnetic medium, then the process step of forming the four patterns and the process step of forming the thin film conductor need to be performed, thus causing an increase in the number of manufacturing process steps required in some cases.

To overcome such a problem, a magnetic sensor (1) according to a seventh aspect adopts the following configuration.

Specifically, a magnetic sensor (1) according to a seventh aspect detects a position of a detection target (2) based on a change in magnetic field strength to be caused by relative movement of the detection target (2) in a first direction (D1). The magnetic sensor (1) includes a plurality of magnetoresistance pattern portions (131-134), a first wiring pattern portion (135), and a second wiring pattern portion (136). The plurality of magnetoresistance pattern portions (131-134) forms a bridge circuit. The first wiring pattern portion (135) is connected to a power supply terminal (21). The second wiring pattern portion (136) is connected to a ground terminal (22). Each of the first wiring pattern portion (135) and the second wiring pattern portion (136) is made of the same material as the plurality of magnetoresistance pattern portions (131-134). The plurality of magnetoresistance pattern portions (131-134) are arranged side by side in the first direction (D1). The plurality of magnetoresistance pattern portions (131-134) includes: a first magnetoresistance pattern portion (131) and a second magnetoresistance pattern portion (132) which are connected together in series; and a third magnetoresistance pattern portion (133) and a fourth magnetoresistance pattern portion (134) which are connected together in series. The first wiring pattern portion (135) includes a first wiring portion (1351) and a second wiring portion (1352). The first wiring portion (1351) is connected to the first magnetoresistance pattern portion (131). The second wiring portion (1352) is connected to the third magnetoresistance pattern portion (133). The second wiring pattern portion (136) includes a third wiring portion (1361) and a fourth wiring portion (1362). The third wiring portion (1361) is connected to the second magnetoresistance pattern portion (132). The fourth wiring portion (1362) is connected to the fourth magnetoresistance pattern portion (134). The magnetic sensor (1) further includes a first output terminal (23) and a second output terminal (24). The first output terminal (23) is connected to the first magnetoresistance pattern portion (131) and the second magnetoresistance pattern portion (132) via the third wiring pattern portion (137). The second output terminal (24) is connected to the third magnetoresistance pattern portion (133) and the fourth magnetoresistance pattern portion (134) via the fourth wiring pattern portion (138). The first wiring portion (1351) is located, in a second direction (D2), on one side of the plurality of magnetoresistance pattern portions (131-134). The second wiring portion (1352) is located, in the second direction (D2), on the other side of the plurality of magnetoresistance pattern portions (131-134). The third wiring portion (1361) is located, in the second direction (D2), on the one side of the plurality of magnetoresistance pattern portions (131-134). The fourth wiring portion (1362) is located, in the second direction (D2), on the other side of the plurality of magnetoresistance pattern portions (131-134). The second direction (D2) intersects with the first direction (D1).

This aspect reduces the chances of causing a decline in the positioning accuracy of the detection target (2) while reducing an increase in the number of manufacturing process steps.

Note that the constituent elements according to the first to fifth aspects are not essential constituent elements for the magnetic sensor (1) according to the seventh aspect.

REFERENCE SIGNS LIST

1 Magnetic Sensor
2 Detection Target
21 Power Supply Terminal
22 Ground Terminal
23 First Output Terminal
24 Second Output Terminal
131 First Magnetoresistance Pattern Portion (Magnetoresistance Pattern Portion)
132 Second Magnetoresistance Pattern Portion (Magnetoresistance Pattern Portion)
133 Third Magnetoresistance Pattern Portion (Magnetoresistance Pattern Portion)
134 Fourth Magnetoresistance Pattern Portion (Magnetoresistance Pattern Portion)
135 First Wiring Pattern Portion
136 Second Wiring Pattern Portion
137 Third Wiring Pattern Portion
138 Fourth Wiring Pattern Portion
1311, 1321, 1331, 1341 First Resistance Portion
1312, 1322, 1332, 1342 Second Resistance Portion
1351 First Wiring Portion
1352 Second Wiring Portion
1361 Third Wiring Portion
1362 Fourth Wiring Portion
D1 First Direction
D2 Second Direction
D3 Third Direction
L1 First Distance (Distance)
L2 Second Distance (Distance)
λ Cycle of Magnetization

The invention claimed is:

1. A magnetic sensor configured to detect a position of a detection target based on a change in magnetic field strength to be caused by relative movement of the detection target in a first direction, the detection target being magnetized in the first direction in a predetermined cycle of magnetization,
the magnetic sensor comprising a plurality of magnetoresistance pattern portions that forms a bridge circuit,
the plurality of magnetoresistance pattern portions being arranged side by side in the first direction,
each of the plurality of magnetoresistance pattern portions including a first resistance portion and a second resistance portion that are connected together in series,
each of the first resistance portion and the second resistance portion being formed in a second direction perpendicular to the first direction,
the first resistance portion and the second resistance portion in each of the plurality of magnetoresistance pattern portions being spaced from each other in the first direction by a distance that is one half as long as the cycle of magnetization,
the first resistance portion and the second resistance portion in each of the plurality of magnetoresistance pattern portions being symmetric to each other with respect to a line when viewed in plan in a third direction perpendicular to both the first direction and the second direction.

2. The magnetic sensor of claim 1, wherein
the plurality of magnetoresistance pattern portions includes a plurality of the first resistance portions and a plurality of the second resistance portions,
two out of the plurality of the first resistance portions are adjacent to each other,
two out of the plurality of the second resistance portions are respectively adjacent to the two first resistance portions, and
at least one of the two second resistance portions is spaced in the first direction from at least one of the two first resistance portions by a distance that is one-eighth as long as the cycle of magnetization.

3. The magnetic sensor of claim 1, wherein
each of the plurality of the first resistance portions and the plurality of the second resistance portions included in the plurality of magnetoresistance pattern portions is formed in a meandering shape when viewed in the third direction.

4. The magnetic sensor of claim 1, comprising four magnetoresistance pattern portions as the plurality of magnetoresistance pattern portions, wherein
the four magnetoresistance pattern portions form a full-bridge circuit as the bridge circuit.

5. The magnetic sensor of claim 4, further comprising:
a first wiring pattern portion connected to a power supply terminal;
a second wiring pattern portion connected to a ground terminal;
a third wiring pattern portion connected to a first output terminal; and
a fourth wiring pattern portion connected to a second output terminal, wherein
the plurality of magnetoresistance pattern portions includes:
a first magnetoresistance pattern portion and a second magnetoresistance pattern portion which are connected together in series; and a third magnetoresistance pattern portion and a fourth magnetoresistance pattern portion which are connected together in series, the first wiring pattern portion includes:

a first wiring portion, to which one end portion of the first magnetoresistance pattern portion is connected, the one end portion of the first magnetoresistance pattern portion being opposite from another end portion, adjacent to the second magnetoresistance pattern portion, of the first magnetoresistance pattern portion, and a second wiring portion, to which one end portion of the third magnetoresistance pattern portion is connected, the one end portion of the third magnetoresistance pattern portion being opposite from another end portion, adjacent to the fourth magnetoresistance pattern portion, of the third magnetoresistance pattern portion, the second wiring pattern portion includes:

a third wiring portion, to which one end portion of the second magnetoresistance pattern portion is connected, the one end portion of the second magnetoresistance pattern portion being opposite from another end portion, adjacent to the first magnetoresistance pattern portion, of the second magnetoresistance pattern portion, and a fourth wiring portion, to which one end portion of the fourth magnetoresistance pattern portion is connected, the one end portion of the fourth magnetoresistance pattern portion being opposite from another end portion, adjacent to the third magnetoresistance pattern portion, of the fourth magnetoresistance pattern portion, the third wiring pattern portion is connected to the first magnetoresistance pattern portion and the second magnetoresistance pattern portion, and the fourth wiring pattern portion is connected to the third magnetoresistance pattern portion and the fourth magnetoresistance pattern portion.

6. The magnetic sensor of claim 1, further comprising:

a first wiring pattern portion connected to a power supply terminal;

a second wiring pattern portion connected to a ground terminal;

a third wiring pattern portion connected to a first output terminal; and a fourth wiring pattern portion connected to a second output terminal, wherein each of the first wiring pattern portion and the second wiring pattern portion is made of the same material as the plurality of magnetoresistance pattern portions, the plurality of magnetoresistance pattern portions includes:

a first magnetoresistance pattern portion and a second magnetoresistance pattern portion which are connected together in series; and a third magnetoresistance pattern portion and a fourth magnetoresistance pattern portion which are connected together in series, the first wiring pattern portion includes:

a first wiring portion connected to the first magnetoresistance pattern portion; and a second wiring portion connected to the third magnetoresistance pattern portion, the second wiring pattern portion includes:

a third wiring portion connected to the second magnetoresistance pattern portion; and a fourth wiring portion connected to the fourth magnetoresistance pattern portion, the first output terminal is connected to the first magnetoresistance pattern portion and the second magnetoresistance pattern portion via the third wiring pattern portion, the second output terminal is connected to the third magnetoresistance pattern portion and the fourth magnetoresistance pattern portion via the fourth wiring pattern portion, the first wiring portion is located, in a second direction intersecting with the first direction, on one side of the plurality of magnetoresistance pattern portions, the second wiring portion is located, in the second direction, on the other side of the plurality of magnetoresistance pattern portions, the third wiring portion is located, in the second direction, on the one side of the plurality of magnetoresistance pattern portions, and the fourth wiring portion is located, in the second direction, on the other side of the plurality of magnetoresistance pattern portions.

* * * * *